United States Patent [19]

Luff et al.

[11] 4,361,778

[45] * Nov. 30, 1982

[54] UNIVERSAL PIEZOELECTRIC CRYSTAL HOLDER

[75] Inventors: Martin Luff, Glendale Heights; William G. Skoda, Oak Park, both of Ill.

[73] Assignee: Motorola, Inc., Schaumburg, Ill.

[*] Notice: The portion of the term of this patent subsequent to Sep. 1, 1998, has been disclaimed.

[21] Appl. No.: 211,012

[22] Filed: Nov. 28, 1980

[51] Int. Cl.³ .............................. H01L 41/08
[52] U.S. Cl. ................................... 310/348
[58] Field of Search .................. 310/348–356, 310/342, 344

[56] References Cited

U.S. PATENT DOCUMENTS

| | | | |
|---|---|---|---|
| 2,409,607 | 10/1946 | Bach | 310/348 |
| 2,409,838 | 10/1946 | Cress | 310/348 |
| 3,980,911 | 9/1976 | English | 310/348 |
| 4,079,284 | 3/1978 | Fanshawe | 310/348 |
| 4,267,479 | 5/1981 | Kato | 310/348 |
| 4,287,447 | 9/1981 | Skoda et al. | 310/353 X |

FOREIGN PATENT DOCUMENTS

| | | | |
|---|---|---|---|
| 52-48489 | 4/1977 | Japan | 310/348 |
| 646422 | 2/1979 | U.S.S.R. | 310/353 |

Primary Examiner—Mark O. Budd
Attorney, Agent, or Firm—Mark P. Kahler; Joseph T. Downey; Ed Roney

[57] ABSTRACT

A universal crystal holder is provided which is capable of supporting piezoelectric crystals having virtually any size and shape. The crystal holder includes two support structures, each having a downwardly sloping surface for accepting a side of the crystal to be supported. Since crystals placed in the universal crystal holder of the invention are self-aligned, the placement of a crystal in the holder is easily automated.

5 Claims, 7 Drawing Figures

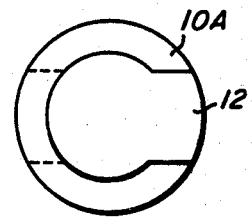
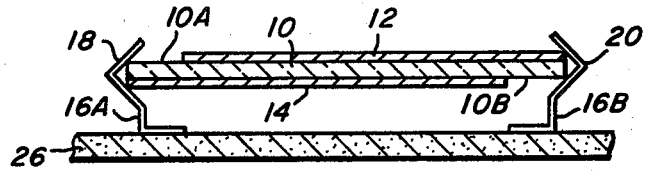
FIG. 1A
FIG. 1B PRIOR ART
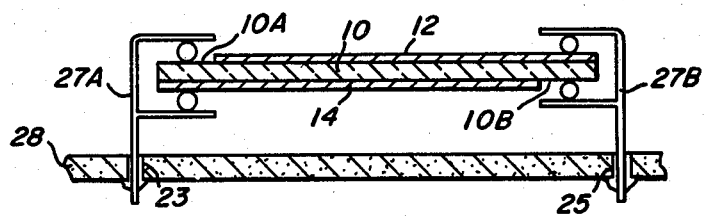
FIG. 1C PRIOR ART
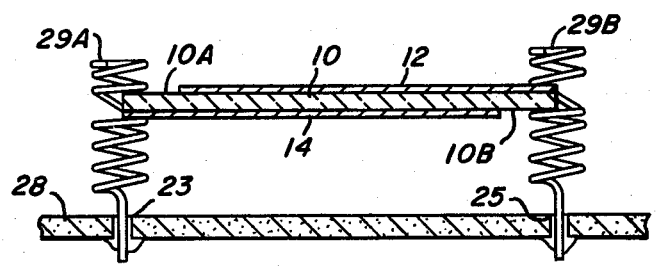
FIG. 1D PRIOR ART
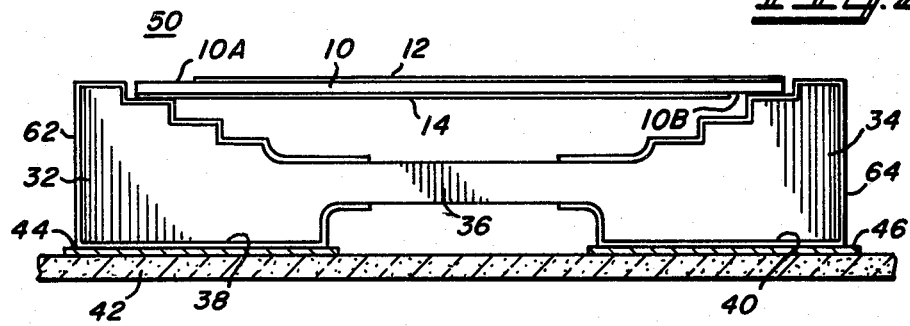
FIG. 2A

UNIVERSAL PIEZOELECTRIC CRYSTAL HOLDER

BACKGROUND OF THE INVENTION

This invention relates generally to crystal holders, and more particularly to piezoelectric crystal holders capable of accommodating crystals having virtually any diameter or thickness.

DESCRIPTION OF THE PRIOR ART

To provide support to piezoelectric crystals and to achieve electrical connection of the same to printed circuit boards or other substrates, spring tempered holder clamps are conventionally employed. One such spring tempered clamp is the V spring clamp (see FIG. 1B) which comprises a pair of thin metallic prong-like brackets, each including a V-shaped structure at the top of the bracket. Appropriate portions of the periphery of the relatively fragile quartz crystal are engaged between the apexes of the two V-shaped structures to provide support to the crystal and to achieve electrical connection thereto. Prior to placement of a crystal in a V spring clamp, each of the brackets comprising the clamp are situated on conductive pads on a selected substrate. Soldering is employed to mount the brackets to the conductive pads on the substrate. A disadvantage of this type of clamp is that when soldering of the brackets to the substrate is attempted, the brackets tip over during a significant number of such mounting attempts.

Other types of spring tempered clamps which employ two brackets to support the crystal are the F-shaped holder (See FIG. 1C) and the coil spring holder (See FIG. 1D). Prior to placement of the crystal in such mounting clamps, the two brackets comprising the clamp are typically situated on respective metallic pads provided at selected locations on the substrate or situated in holes provided through the substrate in the middle of such metallic pads. The brackets are conveniently soldered to the metallic pads to achieve electrical and mechanical connection thereto. Due to the generally fragile nature of these brackets and the brackets of FIG. 1B, placement of the brackets on the substrate is a procedure typically performed manually and not easily subject to automation. Not only are these brackets easily bent and broken, but also the brackets must be relatively precisely positioned, typically by hand, before a crystal is mounted therebetween.

The above-mentioned crystal holders are capable of holding crystals having one preselected diameter per holder. However, a crystal holder capable of accommodating a crystal having either one of two preselected rectangular sizes is known. Such crystal holder includes a main cavity having a generally irregular polygon shape. The sides of the cavity define internally a plurality of rectangular boundaries of different peripheral sizes. Each rectangular boundary is capable of accepting a crystal having the preselected size and shape commensurate thereto. All of the rectangular crystal holding chambers of such holder are positioned in the same horizontal plane. A spring structure is relied on to hold the crystal in the selected rectangular chamber. Such a crystal holder, although capable of accommodating crystals of various sizes, is difficult to mount on a printed circuit board or other substrate in an automated manner. Spring structures are by nature inherently difficult to automatically feed. Additionally, external contacts on the holder do not have a common surface to allow direct contact to be made between the contacts and a substrate.

In U.S. Pat. No. 4,287,447, issued to Skoda et al. on Sept. 1, 1981, having therefor the same inventors and assignee as the present patent application, a crystal holder is described and claimed which is capable of supporting crystals having a plurality of fixed sizes. Such a crystal holder includes two side portions, each portion having a plurality of stair step-like structures thereon. The steps of each side portion align with the steps of the other side portion such that crystals of various preselected sizes may be supported between the steps of the holder. The number of crystal sizes which the holder is capable of supporting is limited by the number of step pairs of the holder. FIGS. 2A and 2B show such a crystal holder as holder 50.

It is one object of the present invention to provide a crystal holder capable of accepting crystals having virtually any of a continuum of crystal sizes. The holder of the invention is not limited to a plurality of fixed crystal sizes.

Another object of the invention is to provide a crystal holder which is easily positioned and mounted on a hybrid circuit substrate, a printed circuit board or other substrate by automated machinery.

These and other objects of the invention will become apparent to those skilled in the art upon consideration of the following description of the invention.

BRIEF SUMMARY OF THE INVENTION

The present invention is directed to providing a crystal holder, the positioning and mounting of which on a selected substrate is easily subject to automation, and which accommodates crystals having virtually any size.

In accordance with one embodiment of the invention, a crystal holder includes a first element of electrically conductive material having a downwardly sloping first surface for supporting a side of a crystal. The holder further includes a second element of electrically conductive material having a downwardly sloping second surface for supporting another side of a crystal. The second surface faces the first surface in a V-like manner. Each of the first and second elements are electrically insulated from the other and include a mounting portion facing the other of the first and second elements. The mounting portion is sufficiently massive to prevent the first and second elements from tipping over when mounted on a substrate by a solder reflow operation.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 1A shows a typical crystal to be mounted in a crystal holder.

FIG. 1B shows the crystal of FIG. 1A mounted in one type of conventional spring tempered crystal holder which is attached to a selected substrate.

FIG. 1C shows another type of conventional spring tempered crystal holder.

FIG. 1D shows yet another type of conventional spring tempered crystal holder.

FIG. 2A is a side view of a crystal holder comprised substantially of an electrically insulative material shown with a crystal mounted therein, the holder being situated on a substrate.

DETAILED DESCRIPTION OF THE PREFERRED EMBODIMENT

Figure 2B:
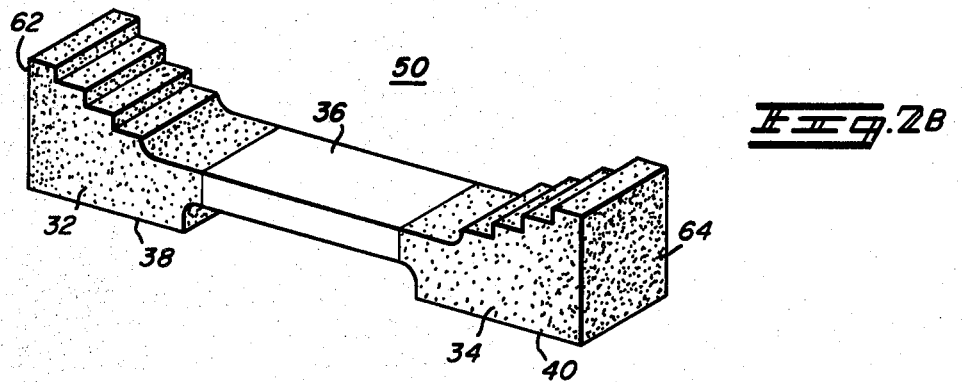
FIG. 2B is a perspective view of the crystal holder of FIG. 2A.

FIG. 1A illustrates a typical crystal 10 for which mounting in a crystal holder or bracket is desired. Crystal 10 is substantially circular and includes opposed major surfaces 10A and 10B. Electrically conductive electrodes 12 and 14 (shown more clearly in FIG. 1B) are situated on major surfaces 10A and 10B, respectively, to facilitate connection of crystal 10 to external electrical circuitry.

FIG. 1B shows one type of conventional spring tempered crystal holder as holder 16 comprised of thin metallic brackets 16A and 16B. Bracket 16A and 16B each include a straight vertical portion having opposed ends. V-shaped grooves 18 and 20 are situated at one end of brackets 16A and 16B, respectively, in the manner shown in FIG. 1B so as to accept crystal 10 therebetween. The remaining ends of brackets 16A and 16B are typically bent at right angles to facilitate attachment of brackets 16A and 16B to a substrate 26. Prior to placement of crystal 10 between brackets 16A and 16B, brackets 16A and 16B are attached to respective mounting pads (not shown) situated on substrate 26. Once brackets 16A and 16B are so situated, these brackets are typically aligned by hand to have the precise distance therebetween necessary to accommodate crystal 10.

FIG. 1C shows another type of conventional spring tempered crystal mounting fixture as holder 27. Holder 27 comprises two brackets, 27A and 27B, each having an F-shaped structure for accepting an edge of crystal 10 between the horizontal arms of the F. The vertical portions of the F-shaped brackets 27A and 27B are conveniently situated in respective holes 23 and 25 in a substrate 28 or otherwise attached to substrate 28. After such mounting, manual adjustment of the distance between brackets 27A and 27B by bending the brackets is often required to assure proper crystal placement.

FIG. 1D shows another conventional spring tempered crystal holder as holder 29 which includes two coil spring-like brackets 29A and 29B. An edge of crystal 10 is positioned between adjacent loops of each of brackets 29A and 29B to support crystal 10. The distance between brackets 29A and 29B is typically manually adjusted by bending the brackets sufficiently to accommodate a crystal of selected size therebetween.

FIG. 2A shows a side view of a crystal holder 50 described and claimed in the aforementioned Skoda et al. patent. Holder 50 is capable of supporting crystals having different preselected sizes. Crystal holder 50 includes crystal support structures 32 and 34 joined together by a central connecting element 36. Crystal support structures 32 and 34 each include a plurality of steps, each step of structure 32 being horizontally aligned with a corresponding step of structure 34. Support structures 32 and 34 are comprised of electrically insulative material and respectively include mounting feet 38 and 40 situated on the bottom surfaces thereof.

Layers 62 and 64 of electrically conductive material cover a sufficient portion of the respective surfaces of structures 32 and 34 to form electrically conductive paths between the respective stair steps and mounting feet 38 and 40 thereof. Mounting feet 38 and 40 are situated on and conveniently soldered to conductive pads 44 and 46 which are affixed to a substrate 42. Mechanical and electrical connection between holder 50 and external electrical circuitry are thus achieved. Conductive epoxy is employed to electrically connect electrodes 12 and 14 to crystal support structures 32 and 34.

A perspective view of crystal holder 50 is shown in FIG. 2B. It is noted that holder 50 is capable of accommodating a crystal having one of a plurality of predetermined fixed sizes according to the spacing selected between the steps of crystal holder 50 when fabricated. It is clear that crystals having dimensions greater than or less than the spacing between the steps of a particular holder 50 may be accommodated by fabricating another crystal holder 50 having a spacing between steps commensurate with the other desired crystal sizes. To summarize, the dimensions of crystal holder 50 may be fabricated in such a manner as to accommodate virtually any size crystal, but a particular crystal holder 50 will not accommodate all crystal sizes in a universal manner. This problem is solved by the universal crystal holder of the present invention which accommodates crystals having virtually any dimensions.

Figure 3:
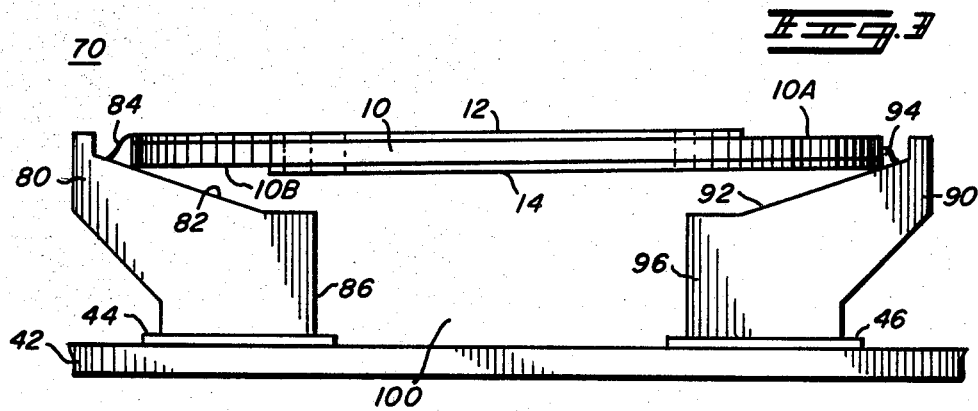
FIG. 3 is a side view of the crystal holder of the present invention.

FIG. 3 shows a universal crystal holder 70 in accordance with the present invention. Holder 70 includes crystal support elements 80 and 90 comprised of an electrically conductive material, for example, copper. Support elements 80 and 90 respectively include substantially flat downwardly sloping surfaces 82 and 92. Surfaces 82 and 92 face each other and are adapted to receive a crystal 10 thereon in the manner shown in FIG. 3. A crystal having virtually any size may be situated on and supported by crystal support structures 80 and 90. The locations of support structures 80 and 90 on a substrate 42 are selected such that sufficient distance exists between sloping surfaces 82 and 92 to accommodate crystal 10 thereon. One side surface of crystal 10 rests on sloping surface 82 as shown in FIG. 3. Surface 82 is electrically coupled to electrode 14 of crystal 10 by a layer 84 of conductive epoxy or other suitable electrically conductive material therebetween. Another side surface of crystal 10 rests on sloping surface 92. Surface 92 is electrically coupled to electrode 12 by a layer 94 of conductive epoxy or other suitable electrically conductive material therebetween. It is seen by inspection that holder 70 of the invention permits easy automation of the step of positioning crystal 10 in the crystal holder. Alignment of a crystal within holder 70 is a relatively simple matter because precise positioning of crystal 10 within holder 70 is not required. Crystal 10 may simply be deposited on sloping surfaces 82 and 92 in an approximately horizontal manner. Crystal 10 naturally comes to rest in an acceptable position in holder 70. Layers 84 and 94 are then deposited so as to electrically and mechanically connect crystal 10 to holder 70.

Support structures 80 and 90 are conveniently respectively mounted on electrically conductive pads 44 and 46 situated on substrate 42. More specifically, crystal support structures 80 and 90 respectively include mounting portions 86 and 96 which are electrically and mechanically connected to conductive pads 44 and 46 on substrate 42 by layers of solder or other suitable electrically conductive material therebetween. To accomplish such connection, a conventional solder reflow process, well known in the art, may be employed. Mounting portions 86 and 96 are located at the lower portions of support structures 80 and 90 which, in this embodiment, exhibit a substantially wing-like geometry as seen in FIG. 3. Mounting portions 86 and 96 each include a sufficient mass to prevent crystal support structures 80 and 90 from tipping over when subjected to the above-described solder reflow process during the course of mounting structures 80 and 90 on substrate 42.

Crystal support structures 80 and 90 are electrically insulated from each other. As shown in FIG. 3, this electrical insulation may be accomplished by situating an air gap 100 between support structures 80 and 90. Alternatively, an electrically insulative material, for example, plastic or rubber, may be situated between support structures 80 and 90 at the location designated for air gap 100.

Figure 4:
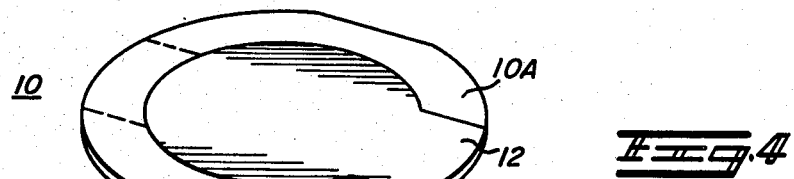
FIG. 4 is an exploded perspective view of the crystal holder of FIG. 3 shown mounted on a substrate.
Figure 4:
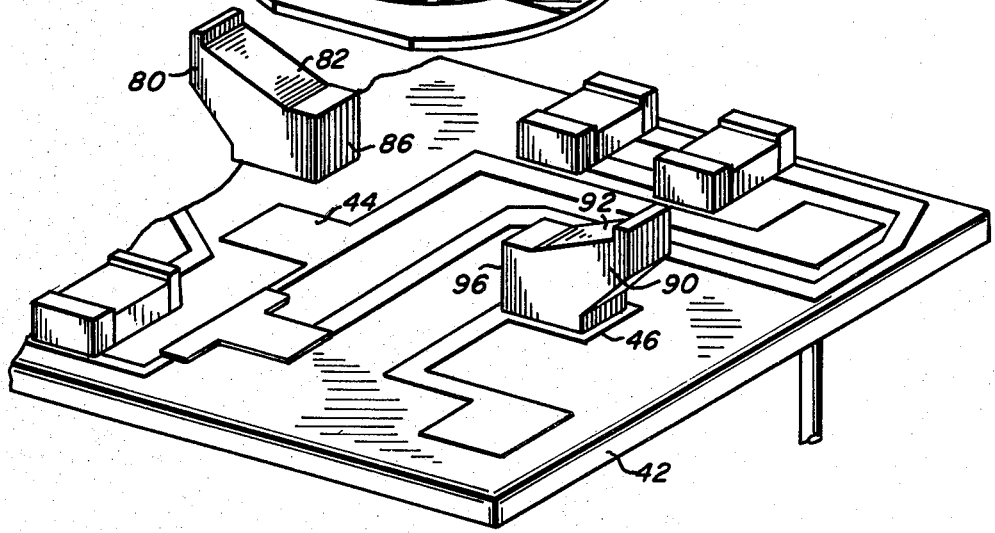

To fabricate crystal holder 70, conventional die techniques, well known to those skilled in the art are employed. More specifically, a die is formed in the shape of crystal support structure 80 shown in FIG. 3 and more clearly in the exploded perspective view of FIG. 4. Using the well known sintered metal or pressed powder process, the die is filled with a metallic powder according to such process. A powder of nickel silver alloy is used as this powder, although other powders of electrically conductive material are satisfactory. The die and powder are subjected to relatively high temperatures and pressures to form support structure 80 which may be removed from the die upon cooling. Crystal support structures 80 and 90 are symmetrical and thus support structures 80 and 90 are conveniently fabricated with a single die.

The foregoing describes a universal crystal holder capable of accommodating piezoelectric crystals having virtually any size and shape whether substantially circular or rectangular. The placement of the crystals in the crystal holder of the present invention is easily subject to automation.

While only certain preferred features of the invention have been shown by way of illustration, many modifications and changes will occur to those skilled in the art. It is, therefore, to be understood that the present claims are intended to cover all such modifications and changes as fall within the true spirit of the invention.

We claim:

1. A crystal holder for supporting a piezoelectric crystal having upper and lower surfaces including:
   a first element of electrically conductive material having a downwardly sloping first surface for contacting and supporting the lower surface of said crystal at an end thereof;
   a second element of electrically conductive material having a downwardly sloping second surface for contacting and supporting the lower surface of said crystal at another end thereof, said second surface facing said first surface in a V-like manner; and
   each of said first and second elements being electrically insulated from the other and including a mounting portion facing the other of said first and second elements, said mounting portion being sufficiently massive to prevent said first and second elements from tipping over when mounted on a substrate.

2. The crystal holder of claim 1 wherein said first and second elements each exhibit a wing-like geometry.

3. The crystal holder of claim 1 or 2 wherein said electrically conductive material comprises a nickel silver alloy.

4. The crystal holder of claim 1 or 2 wherein said first and second surfaces are substantially flat.

5. The crystal holder of claim 4 wherein said electrically conductive material comprises a nickel silver alloy.

* * * * *